(12) United States Patent
Santos (10) Patent No.: US 8,547,112 B2
(45) Date of Patent: Oct. 1, 2013

(54) INTRODUCED IN MONITORING SYSTEM OF DIELECTRIC STATE OF HIGH VOLTAGE EQUIPMENTS WITH CAPACITIVE INSULATION, SUCH AS CONDENSIVE BUSHINGS, CURRENT TRANSFORMERS, POTENTIAL TRANSFORMERS AND SIMILAR

(76) Inventor: Eduardo Pedrosa Santos, Atibaia (BR)

( * ) Notice: Subject to any disclaimer, the term of this patent is extended or adjusted under 35 U.S.C. 154(b) by 414 days.

(21) Appl. No.: 12/748,885

(22) Filed: Mar. 29, 2010

(65) Prior Publication Data

US 2011/0234243 A1    Sep. 29, 2011

(51) Int. Cl.
*G01R 27/26* (2006.01)

(52) U.S. Cl.
USPC .......................................... 324/659; 324/679

(58) Field of Classification Search
None
See application file for complete search history.

(56) References Cited

U.S. PATENT DOCUMENTS 5,574,378 A * 11/1996 Meyer et al. .................. 324/541
6,177,803 B1 * 1/2001 Train et al. .................... 324/552

* cited by examiner

*Primary Examiner* — Minh N Tang
(74) *Attorney, Agent, or Firm* — McKee, Voorhees & Sease, P.L.C.

(57) ABSTRACT

A system and method for monitoring a dielectric state of high voltage equipment. A leakage current is measured and compared to a programmed limit value. An alarm is activated if the leakage exceeds the limit value to indicate that insulation has seriously deteriorated. The leakage current measurement is verified using a comparison of individual leakage currents with a change in a vector sum of leakage currents.

7 Claims, 6 Drawing Sheets

INTRODUCED IN MONITORING SYSTEM OF DIELECTRIC STATE OF HIGH VOLTAGE EQUIPMENTS WITH CAPACITIVE INSULATION, SUCH AS CONDENSIVE BUSHINGS, CURRENT TRANSFORMERS, POTENTIAL TRANSFORMERS AND SIMILAR

BACKGROUND OF THE INVENTION

1. Briefing

This deed contemplates improvements in a system for a direct and continuous monitoring of quick evolution defects in capacitive insulation that also allows monitoring in real time condensive bushings and other high voltage equipments. It also allows monitoring Bushing Potential Devices (BPDs) equipped bushings as well as monitoring bushing used in high voltage direct current (HVDC) systems.

2. Introduction

In high voltage equipments, such as power transformers and reactors, current transformers, potential transformers and others' bushings, the use of capacitive insulating systems, where the high voltage insulation in relation to ground potential is gradually done, with capacitive voltage dividers and using capacitive insulations systems, is most usual.

Due to the importance of such high voltage equipments for the reliability of the electric power generation, transmission and distribution, the monitoring in real time of their state is a more and more regular practice that aims at occasional defects precociously detecting and diagnosing therefore avoiding interruptions in power supply or "black-outs".

Amongst the several parts of the equipments monitored for defects detection, capacitive type insulating systems, used in bushings, transformers, potential transformers and others, are pointed out once such insulating systems are submitted to high stresses and their total failure frequently provokes explosions as well as fires that may damage also other equipments in the nearness and cause heavy injuries to people around.

STATE OF THE ART

One of the main techniques used in the state of the art for a monitoring in real time capacitive insulations, such as those employed in bushings as well in other equipments, is the vector sum of the leakage currents, as described in the U.S. Pat. No. 6,177,803.

When high voltage equipment is energized, its insulation is submitted to a potential difference in relation to the ground that provokes a current crossing its insulation. Such current magnitude is function of the phase-ground voltage applied as well as of the insulation impedance. This impedance, on its turn, is the result of the composition of the insulation as well as of its resistive losses, called Tangent Delta. This way, any alteration either in the capacitance or in the insulator's tangent delta will provoke a corresponding alteration in the leakage current, which could, theoretically be used to detect alterations in the insulation and to diagnose its state. However, direct use of insulation's leakage current for its diagnosis collides with the size of the alterations which monitoring is desired, once the important alterations from the point of view of the insulation diagnosis may provoke very little leakage current.

Therefore, the technique of the leakage current vector sum of the insulations of the three phases in a three-phase system is used to win this practical limitation. In an arrangement like this, the three leakage currents have an approximately 120 degreed phase shift and usually have the same size as well. This way, the sum of the leakage currents tends to a value expressively less than each one of the leakage currents individually taken. Any alteration in one of the leakage currents, even if insignificant, causes an exactly equal alteration in the sum of the three currents, with the difference that such alteration, which was insignificant when compared with the leakage current magnitude, is now perfectly measurable when compared to the currents' sum, and allows the detection of alterations in the capacitance and/or in the insulation tangent delta as well as the diagnosis of its state.

There is, however, another factor that may provoke variations in the leakage current as well as in the currents sum: the alterations in the phase-ground electric system voltages. In the currents vector sum used in the state of the art methodology, this influence is eliminated by measurements statistic filtering made during a reasonably long period of time, days or weeks. Such filtering requires, however, a delay in the alterations detection process, such a way that changes either in the capacitance or in the tangent delta are detected only some days after their occurrence. As a consequence, the emission of insulation defect alarms is also some days delayed, so that, in case of quick evolution defects, the high voltage equipment may come to failures, with explosion and fire, before the monitoring system may emit any alarm.

In the specific applications for the high voltage equipments condensive bushings monitoring, as, for instance, a transformer, the leakage bushing insulation current measurement should be done by the state of the art monitoring systems by connecting the monitoring system to the bushing's capacitive tap, that is nothing else than an outlet which allows an electric access to the bushing capacitive insulation. This same capacitive tap, however, may also be used in another application, the connection of the denominated "Bushing potential devices—BPD". Such BPDs are mainly used to measure high voltage systems phase-ground voltages, and, for such purpose, they have an inside circuit that converts voltage as well as current signals present in the bushing capacitive tap in an output of about 115V proportional to the phase-ground voltage, therefore acting in a similar way to that of a PT (potential transformer). The inside circuit of a BPD basically consists of a capacitor connecting tap to ground, forming together with the insulation capacitance a capacitive voltage divider, making the voltage in the tap proportional to the phase-ground voltage, as well as a transformer that converts the voltage in the tap to a standard value, 115V usually, that is made available at the BPD outlet.

In the cases where the bushing tap is used for the BPD connection, the use of this same tap for the monitoring system becomes infeasible. In these cases, the state of the art monitoring systems have the disadvantage of forcing the user either to choose to keep the BDP and to do not install the in real time monitoring system or to install the monitoring system and to remove the BDP, substituting it by a PT outside the transformer, of much higher cost.

Another application where the condensive bushings play an essential role are the potential transformers used in High Voltage Direct Current (HDVC), where the DC (direct current) is converted into AC (alternate current) by some switching device, thyristors typically, which is interposed between the direct voltage and the primary windings of one or more power transformers. The thyristors cyclically conduct and interrupt the circuit, so that a pulsed direct voltage is applied to the transformers primary windings. Such pulses are generated in such a sequence that their integration results in an approximately sinusoidal wave format that is obtained in the transformer's secondary winding under an AC voltage format.

In this application, the condensive bushings connected to the transformer's primary windings have not their insulation state monitored in real time, for the format of the wave applied to these bushings is not an AC one but rather a pulsed DC one. To explain the state of the art monitoring difficulty in the bushing monitoring role in HVDC systems, it will be interesting to initially observe how a conventional in AC voltage bushing insulation in real time monitoring works, where the bushing tap, which allows access to its capacitance, is directly connected to the monitoring system measuring entrance by a tap adaptor. This way, the bushing insulation alternate leakage current, flows directly to the monitoring system measurement impedance, that, by this AC current measurement, is able to calculate the impedance as well as the insulation tangent delta and so its state to diagnose. Same bushing, when submitted to the HDVC systems' pulsed DC voltage instead of to the conventional systems AC voltage does not generate in its tap a sinusoidal leakage current, but rather a highly distorted leakage current, with harmonic components of relatively high frequency. Should the state of the art monitoring system be applied to a bushing that is working in such situation, its entry would not meet the capacitive sinusoidal current, 90 degrees phase shifted in relation to the phase-ground voltage, which has made difficult as well impeded the monitoring application in real time to bushings applied in HVDC systems.

Therefore, the risk of catastrophic failures in such bushings that work in DC regimen is increased once their dielectrics are submitted to high stresses and their state is only monitored by tests, not in real time, made at a periodicity of several years and that depend upon disconnecting the equipment. In a similar way, the condensive bushings used in the tyristors outlets terminals are not monitored in real time for they are submitted to the same pulsed DC voltage, being therefore subject to the same risks of catastrophic failures.

DETAILED DESCRIPTION OF THE PREFERRED EMBODIMENT

The new invention herein described contemplates improvements introduced in dielectric state of high voltage equipment with capacitive insulation monitoring systems, such as condensive bushings, current transformers, potential transformers and similar.

Figure 1:
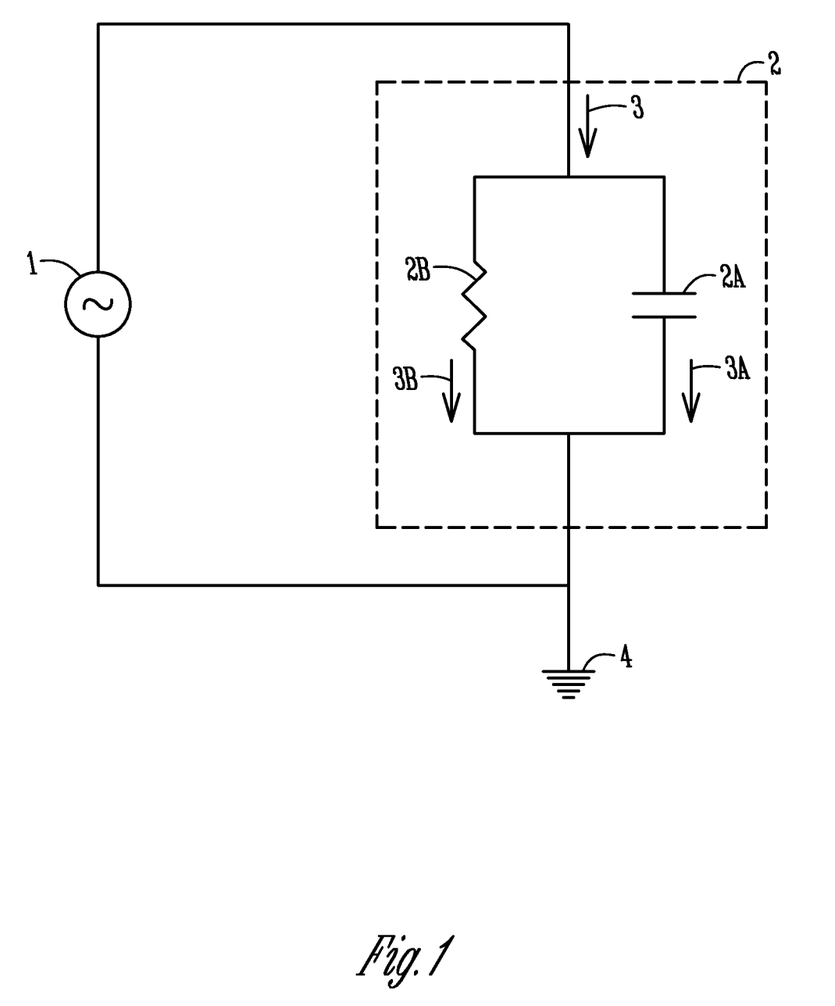
FIG. 1: Schematic diagram of the insulation leakage current continuous direct monitoring.

Referring to FIG. 1, when high voltage equipment is energized, its insulation (2) is submitted to a potential difference in relation with the ground (4) that provokes the circulation of a current (3) through its insulation (2). The magnitude of such current is function of the applied phase-ground voltage (1) and of the insulation impedance as well. Such impedance, on its turn, is the result of the insulation capacitance composition (2A) as well as of its resistive losses (2B), denominated tangent delta. This way, any alteration either in the capacitance (2A) or in the insulator (2) tangent delta (2B) of the insulator (2) will result in a correspondent increase in the resistive (3B) as well as in the capacitive (3A) components of the leakage current (3), leading its import to increase.

Based in such fact, the first improvement consists of directly continuously monitoring the insulation (2) leakage current (3), comparing it with a limit value that, when exceeded, indicates the occurrence of a serious deterioration in the insulation (2), activating an alarm in the monitoring system, without the delays that are present in the state of the art monitoring systems, usually hours or days. With the purpose of avoiding false alarms emission due to the leakage current (3) increase caused by the electric system phase-ground (1) voltage increase, such import is scheduled by the user taking the leakage current import (3) in normal operation conditions, with its insulation (2) in a good state as well as with phase-ground voltage (1) in its nominal import and calculating over such leakage current import (3) an increase percentage higher than the greatest permanent increase percentage expected for the electric system phase-ground voltage (1).

With the purpose of also avoiding false alarms occurrences due to an increase in the system's phase-ground voltage (1) higher than the considered increase percentage, even if for a short period, when detecting that the leakage current (3) exceeds the scheduled limit import, the monitoring system starts counting the time during which the current (3) lasted exceeding such limit. Whilst such time counting would not reach the temporization import scheduled by the user, the alarm emission will be withheld and after the counting would have reached the scheduled temporization, the deteriorated insulation indicating alarm will be emitted. Should the leakage current (3) return to an import under the limit during this time counting, such counting shall be interrupted and annulled, with the purpose of avoiding a false alarm emission.

As the temporization import scheduled by the user is about seconds or minutes, such temporization function does not substantially delay the deteriorated insulation alarms emission. Furthermore, the user may schedule such temporization as small as he would wish, minimizing any delay.

Similarly to what above stated, the monitoring system allows the user to schedule more than one limit value for the insulation (2) leakage currents (3), emitting a different alarm for each scheduled limit. This way, with an appropriated scheduling of the various limits, each emitted alarm may also indicate a different insulation (2) deterioration degree. Such recourse also allows, should a critical deterioration state be reached, the alarm emitted by the monitoring system to be used by the user to compel the emergency disconnection of the high voltage equipment. For such purpose, the deterioration alarms may be associated to one or more outlet electric contacts of the monitoring system, that are used to send the emergency disconnection order of the high voltage equipment.

The described monitoring system also allows the scheduling of the superior limits for the leakage currents (3), as above described, to be automatically done, in a process that consists of a learning period, which duration time may be scheduled by the user, during which the monitoring system will measure the leakage currents (3) and will register the highest imports they would have reached. At the end of the learning time, a previously scheduled percentage will be added to such highest imports, being therefore the leakage currents limits obtained, already incorporating a tolerance to avoid false alarms.

In insulation state monitoring systems, the occurrence of false alarms is extremely undesired, for they may unnecessarily lead to remove from operation vital equipment for the electric power supply to a region. For such reason, the improvements introduced in the monitoring system include a verification of the leakage current measurement that uses the vector sum of the three leakages currents in a three phase system.

Figure 2:
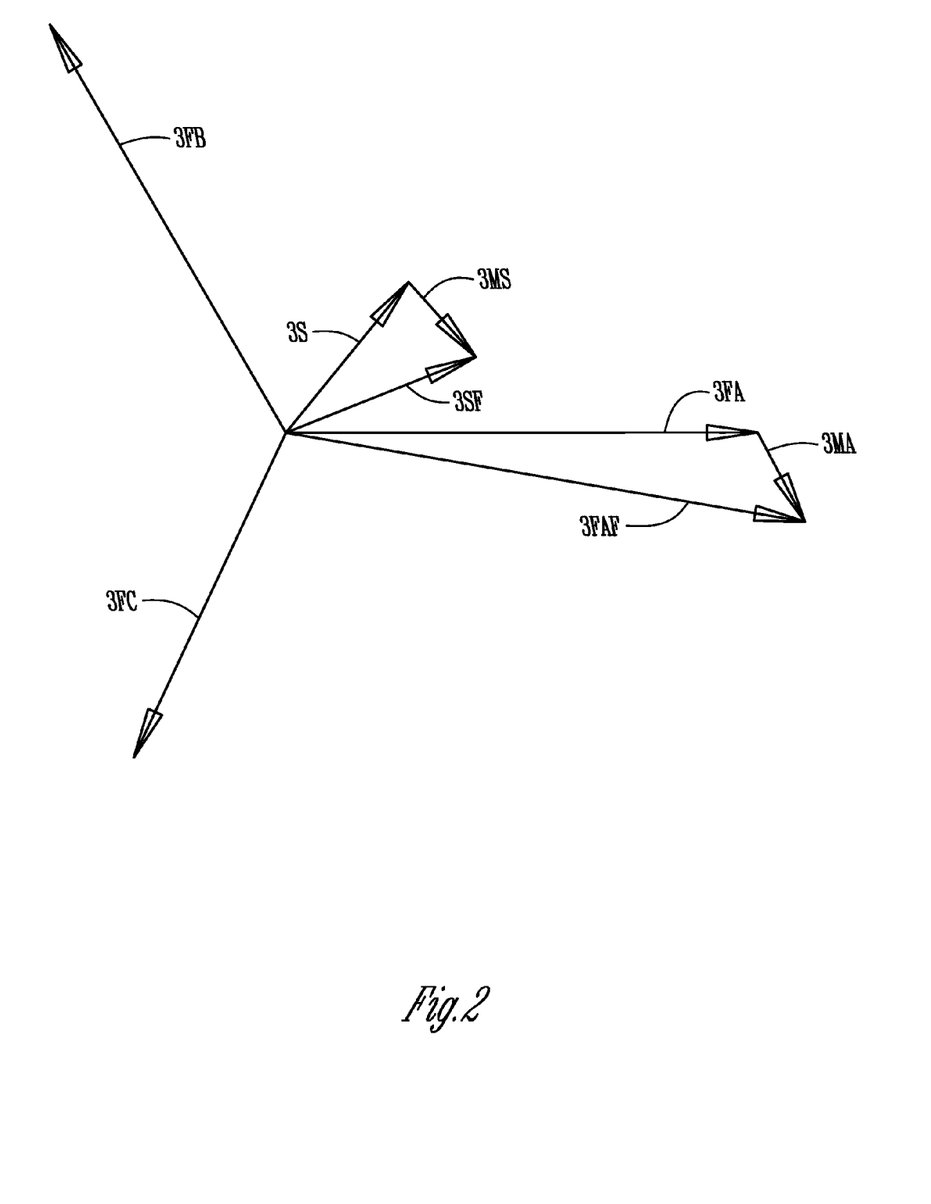
FIG. 2: Vector diagram of the leakage current measurement consistency checking.

As FIG. 2 shows, the consistency verification is based on the fact that an alteration in any of the individual leakage currents of phases A (3FA), B (3FB) or C (3FC) of the system provokes an alteration of same magnitude and angle in the vector sum (3S) of the three leakage currents (3FA, 3FB, 3FC). Therefore, should the insulation of phase A, for instance, suffer a deterioration that provokes an alteration (3MA) in the leakage current, that changes from an initial import (3FA) to a final one (3FAF), the sum of the currents shall also suffer an alteration (3MS) of practically same import as that of alteration (3MA), changing from the initial import (3S) to the final one (3SF).

Figure 3:
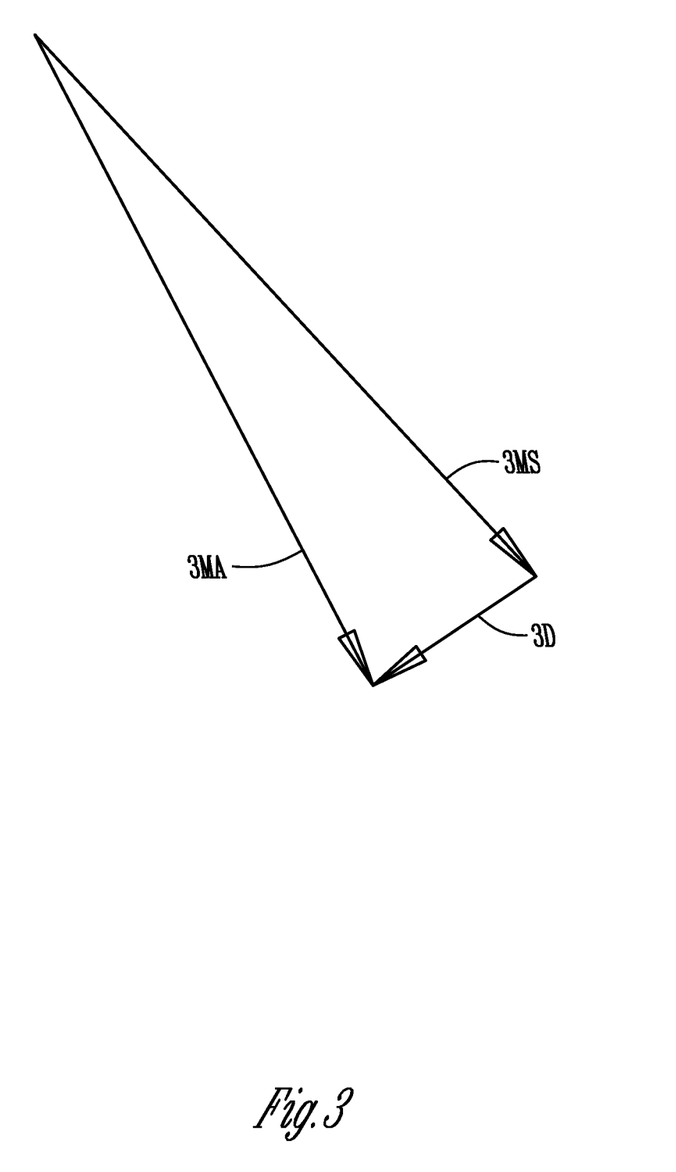
FIG. 3: Diagram of the vectorial difference calculation between the alteration suffered by the leakage current and the alteration suffered by the sum current.

As FIG. 3 amply illustrates, the monitoring system calculates, therefore, the vectorial difference (3D) between the alteration (3MA) suffered by the leakage current (3FA) of phase A and the alteration (3MS) suffered by the sum current (3S). Should the increase of the leakage current (3FA) of phase A be true and not caused by some failure in the monitoring system or in its electric connections, such difference shall be little. Should the vectorial difference (3D) be smaller than the scheduled limit, the monitoring system will consider that the detected alterations are valid and correct, and will allow the emission of a deteriorated insulation alarm should the leakage current last above the superior limits for a time longer than the scheduled temporization, as above already explained. In the opposite case, should the vectorial difference (3D) be greater than the scheduled limit import, the monitoring system will consider that the detected alterations are not valid, and will block the deteriorated insulation alarms emission even should the leakage current (3FA) last above the superior limits for a time longer than the scheduled temporization.

Should the vectorial difference (3D) between the alteration (3MA) suffered by the leakage current (3FA) and the alteration (3MS) suffered by the vector sum (3S) be above the scheduled limit detected, the monitoring system will start counting the time during which the vectorial difference (3D) would have lasted above the limit import. Should this time counting reach a previously fixed import, an alarm shall be emitted indicating that there is a failure either inside the monitoring system or in its electric connections. Should during this time counting the vectorial difference (3D) return to an import under that limit, the time counting shall be interrupted and annulled, avoiding, therefore, the emission of an unnecessary failure alarm.

Figure 4:
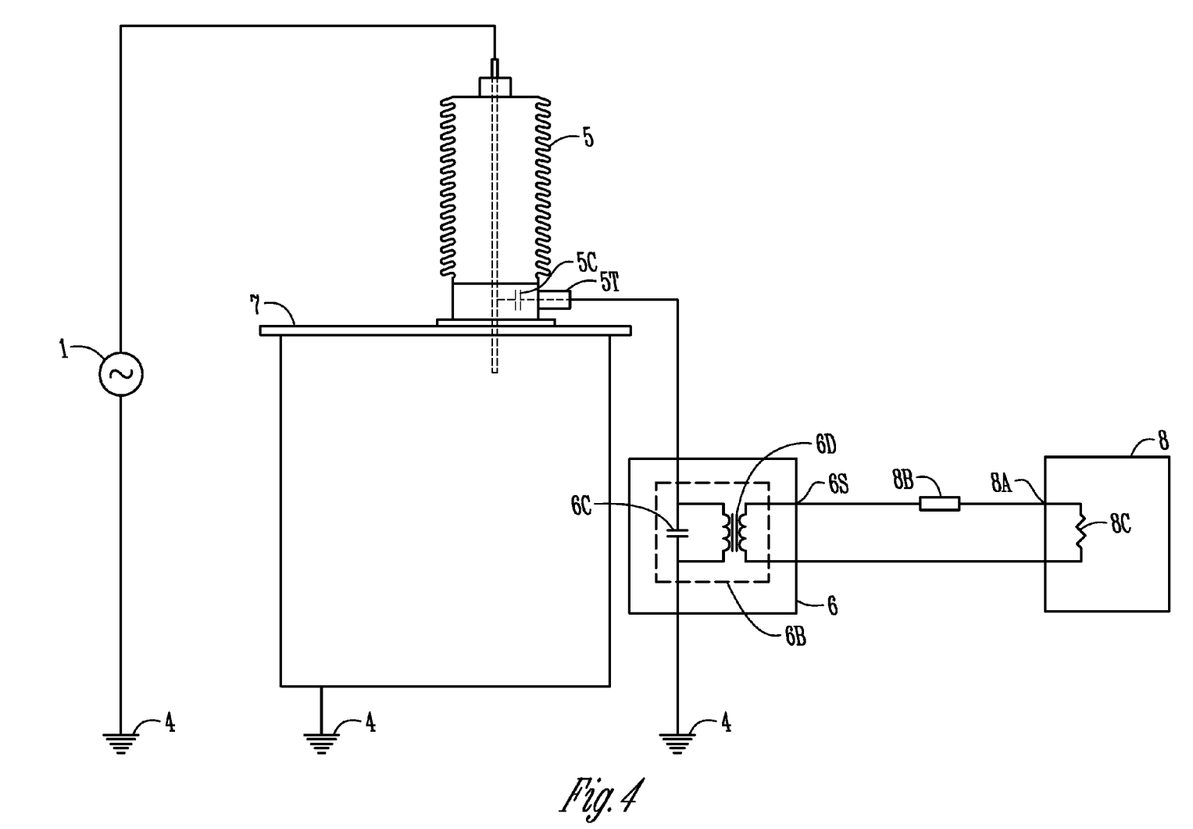
FIG. 4: Schematic diagram of the condensive bushings monitoring improvement with Bushings Potential.

A second improvement introduced in the monitoring system, as illustrated in FIG. 4, consists of permitting the monitoring of condensive bushing (5) that are endowed with Bushings Potential Devices (BPDs) (6), connected to the tap (5T), that would not be monitored in the state of the art due to the fact that the tap (5T) is not available to be connected to the monitoring system.

In such applications, specific for the monitoring of condensive bushings (5) in high voltage equipments, as for instance, transformers (7), the BPDs (6) are mainly used for the measurement of the phase-ground voltages (1) of the high voltage system, and for such purpose they are endowed with an inside circuit (6B) that converts the voltage and current signals presents in the capacitive tap (5T) of the bushing (5) in an outlet (6S) of alternate voltage of about 115V proportional to the phase-ground voltage (1) of the system, acting, therefore, similarly to a potential transformer (PT). The inside circuit (6B) of the BPD (6) basically consists, of a capacitor (6C) connecting the bushing tap (5T) to the ground (4), forming together with the insulation capacitance (5C) a capacitive voltage divider, so that the voltage in the tap (5T) will be proportional to the phase-ground voltage (1), and a transformer (6D) that converts the voltage in the tap (5T) into a standard import, usually 115 V, that is then made available at the outlet (6S) of the BPD (6).

The improvement introduced in the monitoring system consists of using as an entry signal for the monitoring system (8) the output voltage (6S) of the BPD (6). Such combination is possible because the voltage at the output (6S) of the BPD (6) is directly affected by the variations in the capacitor insulation (5C) of the bushing (5), so that either capacitance or bushing (5) insulation tangent delta alterations will generate proportional alterations in the module as well as in the output voltage phase (6S) of the BPD (6).

However, as in most of the times the monitoring system (8) entry (8A) is appropriated for current signal of some miliamperes present in the bushing tap, a direct connection of the outlet (6S) of the BPD (6), that has voltage signals of 115V, to the entry (8A) of the monitoring system (8) will not be possible. To such connection allow, the introduced improvement consists of the use of a coupling impedance (8B), that will transduct the 115V alternate voltage present at the outlet (6S) of the BPD (6) into an alternate signal of some miliamperes, appropriated for the entrance (8A) of the monitoring system (8).

As the monitoring system (8) entrance (8A) is appropriated to measure current signals, it will be important for the monitoring system (8) proper operation the combination of the outlet (6S) of the BPD (6) with the coupling impedance (8B) to electrically behave as if it were a current source near to an ideal current source, i.e. with a high impedance shunt. For such purpose, the coupling impedance (8B) must be several times greater than the entrance impedance (8C) of the monitoring system (8). The impedance (8B) calculation is made so that the smallest current import passible of measurement by monitoring system (8) entrance (8A) may be produced.

As coupling impedance (8B) either a resistor or a capacitor may preferably be used, being the use of an inductor also possible. In any of such cases, the used element must have high stability features in its impedance under temperature variations as well as under aging.

Therefore, alterations either in the capacitance or in the bushing (5) capacitor (5C) insulation tangent delta will generate proportional alterations in the miliamperes current signal that arrives to the monitoring system (8), allowing, therefore, the monitoring of bushings (5) that already have their tap (5C) occupied by a BPD (6).

Figure 5:
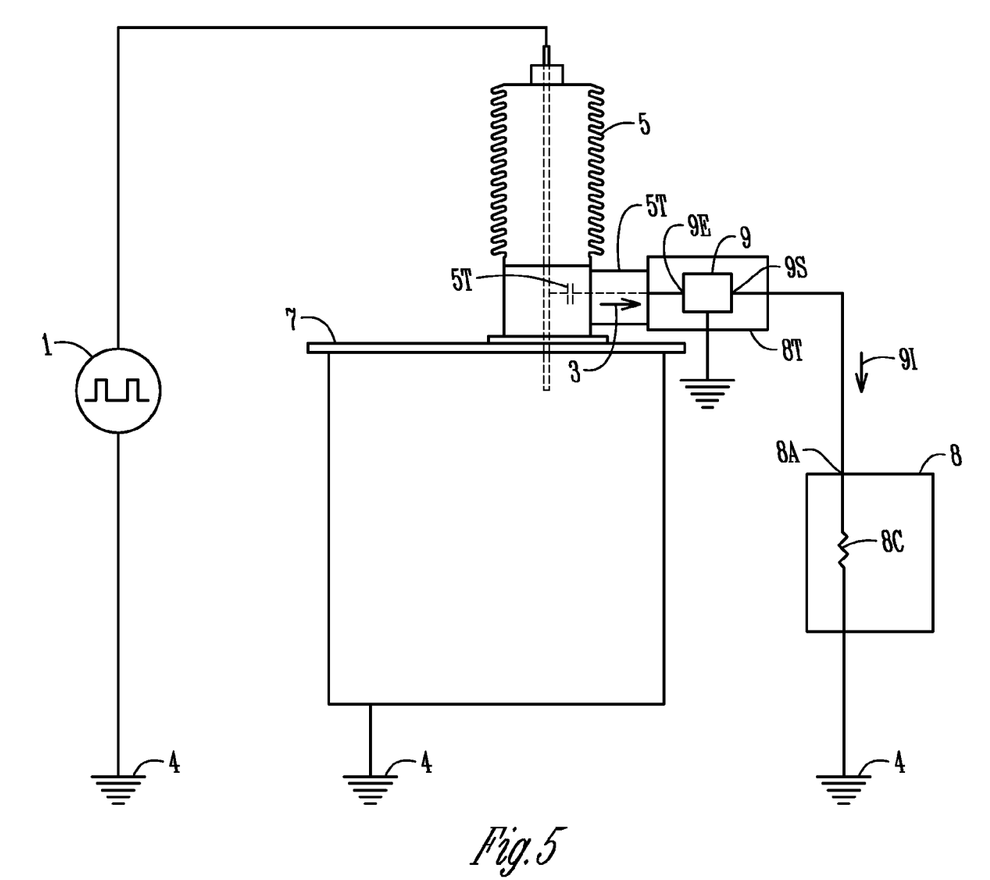
FIG. 5: Schematic diagram of the monitoring improvement of the capacitance as well as of the tangent delta of bushing applied in HVDC systems that work submitted to pulsed direct current.

Another improvement introduced into the monitoring system, as FIG. 5 illustrates, has been the introduction of alterations to allow to monitoring in real time the capacitance as well as the tangent delta of the bushings (5) applied in HVDC systems, which work submitted to the pulsed direct current (1). Such improvement consists of using a signal conditioner (9), installed inside the tap adapter (8T), that receives in its entrance (9E) the leakage current (3) proceeding from the bushing insulation (5) capacitance (5C). The leakage current (3), that has a non-sinusoidal wave format, with high frequency harmonic components, is treated by the signals conditioner (9), which delivers in its outlet (9S) an alternate and sinusoidal current (9I), appropriated for measurement by the monitoring system (8) entrance (8A), by the measurement resistor (8C). The output current (9I) of the signals conditioner (9) is directly influenced by the variations in the bushing (5) insulation (5C) capacitance as well as tangent delta, allowing therefore the monitoring in real time of the bushing (5) state by the monitoring system (8) as well as catastrophic failure prevention.

Figure 6:
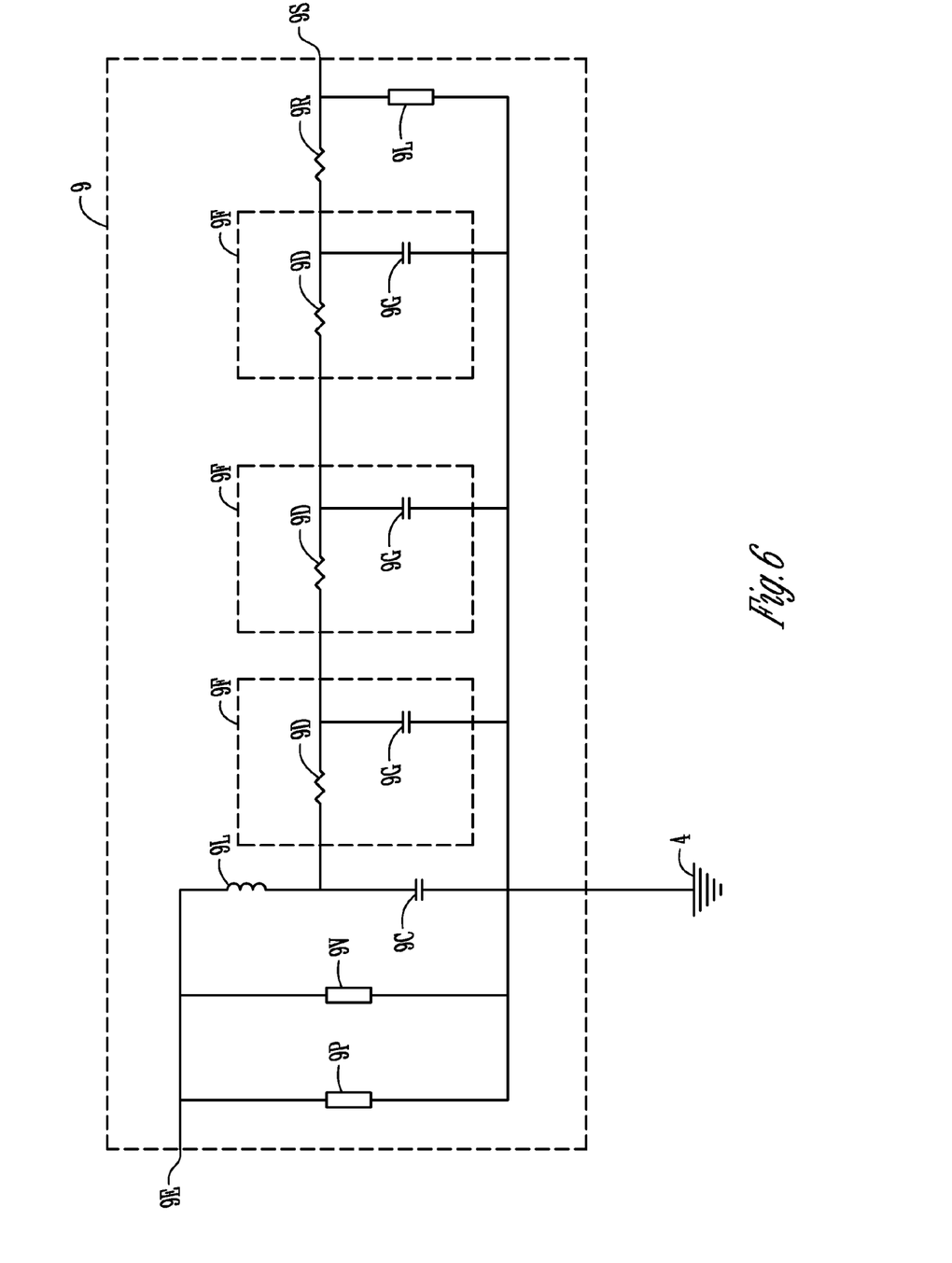
FIG. 6: Schematic diagram of the signals conditioning for in HDVC bushings monitoring.

As FIGS. 5 and 6 show, the signals conditioner (9) has in its entrance (9E) a capacitor (9C), dimensioned to form together with the bushing (5) insulation capacitance (5C) a capacitive voltage divider, for a voltage proportional to the pulsed voltage (1) applied to the bushing 5 to be obtained in the tap (5T), that is also influenced by the variations in the capacitance as well as in the tangent delta of the insulation (5C). An inductor (9L) which has the duty of limiting the high frequency currents intensity that would circulate through the capacitor (9C) during the occurrence of transient overvoltage that may appear in the tap (5T) due to lightning or to other phenomena is connected in series with the capacitor (9C) so that damages to the capacitor (9C) may be avoided. In parallel with the assembly formed by the capacitor (9C) and by the inductor (9L) a gas operated surge arrester as well as a varistor are connected, with the duty of protecting the circuits as well as the components of the signals conditioner (9) when limiting the transient overvoltage that may appear in the tap (5T) due to lightning or other phenomena.

The voltage in the capacitor (9C) presents now a wave format similar to the pulsed voltage (1) applied to the bushing (5), with a smaller content of harmonics than the leakage current (3), but still non-sinusoidal. To extract from the voltage on the capacitor (9C) its sinusoidal component in industrial frequency, 60 Hz or 50 Hz, the capacitor (9C) is connected to the low pass filter entrance (9F), which is constituted of the capacitor (9G) as well as of the resistor (9D), with cut frequency dimensioned for attenuating the harmonic components as well for the least possible attenuating the component in industrial frequency. To increase the filtering efficiency, several equal low pass filters (9F) may be connected in cascade, the outlet of one filter (9F) connected to the entry of the next one (9F), being the total number of filters in cascade equal to the desired order for the filtering action—second order, third order, etc. Therefore, the last filter (9F) capacitor (9G) will present a practically sinusoidal voltage free from harmonics, proportional to the component in industrial frequency of the pulsed voltage (1) and subject to alterations in function of deteriorations occurred in the capacitance as well as in the tangent delta of the bushing (5) insulation (5C).

A resistor (9R) several times greater than the measurement resistor (8C) in the entrance (8A) of the monitoring system (8) is connected to the capacitor (9G) of the last filter (9F) to allow using the leakage vector sum method, usually applied by the monitoring systems (8). Therefore, the signals conditioner (9) outlet (9S) acts as a current source for the monitoring system (8), allowing the use of the currents vector sum method.

For the users' best safety, the signals conditioner (9) outlet has a voltage regulator (9L), typically a transient voltages suppressor or a zener diode, that avoids the voltage on the last filter (9F) on the capacitor (9G) to be present at the outlet (9S) of the conditioner (9) should the interconnection to entrance (8A) cable disconnects, limiting to a few volts the voltage at outlet (9S) and avoiding any electric shocks risk.

Small variations are possible in the signals conditioner (9) circuit, with no alteration in its basic performance. Some variations examples, with no pretension at all of exhausting all possibilities, involve the varistor (9V), that may be connected in parallel to the capacitor (9C) instead of in parallel to the gas operated surge arrester (9P), or yet the substitution of the varistor (9V) by a transient voltages semiconductor suppressor, such as a zener diode.

The invention claimed is:

1. A method for monitoring a dielectric state of high voltage equipment with capacitive insulation using a monitoring system, the method comprising:
    directly and continuously measuring a leakage current (3) of the insulation (2), and comparing the leakage current to a limit value programmed by a user and activating an alarm for serious deterioration of the insulation (2) if the leakage current exceeds the limit value;
    counting a time period during which the leakage current (3) is above that limit value, suppressing any alarm emission until the counted time period reaches a first time delay value programmed by the user, allows an alarm emission after the counted time period reaches the first time delay value, and, if the leakage current (3) returns to a value under the limit value during the counting operation interrupting the time counting and reset to zero;
    checking a consistency of the leakage current measurement through a comparison of a change (3MA) in individual leakage currents (3FA, 3FB, 3FC) against a change (3MS) in a vector sum (3S) of the leakage currents (3FA, 3FB, 3FC), and calculating a vectorial difference (3D) between the change (3MA) in the leakage current (3FA) and the change (3MS) in the sum current (3S);
    permitting the emission of the deteriorated condition alarm if the vectorial difference (3D) is smaller than a permitted difference value;
    blocking the emission of the deteriorated condition alarm if the vectorial difference (3D) is greater than the permitted difference value;
    counting a time during which the vectorial difference (3D) is above a permitted difference value, and activating a monitoring system failure alarm if the time during which the vectorial difference (3D) is above the permitted difference reaches a second time delay value and resetting the time counting value to zero if the vectorial difference (3D) returns to a value under the permitted difference value.

2. The method for monitoring dielectric state of high voltage equipment with capacitive insulation according to claim 1, further comprising providing a plurality of the user programmed limit values for the leakage current (3), and activating different alarms for each one of the programmed limit values.

3. The method for monitoring dielectric state of high voltage equipment with capacitive insulation according to claim 1 or 2 further comprising using one or more deterioration alarms to force an emergency trip of the high voltage equipment, by associating the deteriorated condition alarms to one or more output electric contacts.

4. The method for monitoring dielectric state of high voltage equipment with capacitive insulation according to claim 1 or 2, further comprising automatically programming limit value for the leakage current (3), through a learning period with a user programmed duration, during which the system measures the leakage current (3) and registers a highest value reached; and at an end of the learning period increases such highest value by a percentage previously programmed by the user to obtain the limit value for the leakage current.

5. The method for monitoring dielectric state of high voltage equipment with capacitive insulation according to claim 1, wherein the system monitors leakage currents, capacitance, and tangent deltas of condensive bushings (5) equipped with bushing potential devices (BPDs) (6) connected to a tap (5T), by using the BPDs' (6) output voltage (6S) as a monitoring system (8) input signal by using a coupling impedance (8B) for a transduction of an alternate voltage signal at the output (6S) of the BPDs (6) into an alternate current signal of some miliamperes, appropriated for connection to the system entrance (8A), the coupling impedance (8B) being several times greater than a system entrance impedance (8C), in order to produce the smallest value of current feasible for measurement at the system entrance (8A).

6. The method for monitoring dielectric state of high voltage equipment with capacitive insulation according to claim 5, wherein the coupling impedance (8B) includes a resistor, a capacitor, or an inductor with high stability of impedance in function of temperature variations and aging.

7. The method for monitoring dielectric state of high voltage equipment with capacitive insulation according to claim 1, further comprising:

using the monitoring system to monitor the leakage currents as well as capacitance and tangent delta of condensive bushings (5) equipped with bushing potential devices (BPDs) (6) connected to the tap (5T) by using BPDs' (6) output voltage (6S) as a monitoring system (8) input signal by using a coupling impedance (8B) for the transduction of the alternate voltage signal at the output (6S) of the BPD (6) into an alternate current signal of some miliamperes, appropriated for connection to the monitoring system (8) input (8A), the coupling impedance (8B) being several times greater than the monitoring system (8) input impedance (8C) in order to produce the smallest value of current feasible for measurement at the monitoring system (8) input (8A); and using the monitoring system to monitor the leakage currents as well as capacitance and tangent delta of bushings (5) applied in HVDC systems where the bushings are energized with pulsed DC voltage (1) by using a signal conditioner circuit (9), installed inside the tap adaptor (8T), that receives in its input (9E) the non sinusoidal leakage current (3) coming from the bushing (5) insulation capacitance (5C), performs the conditioning of the leakage current (3) and delivers at its output (9S) an alternate and sinusoidal current (91), directly influenced by the bushing (5) insulation (5C) capacitance and tangent delta variations and appropriate to be measured by the monitoring system input (8A).

* * * * *